United States Patent [19]

Kimura et al.

[11] Patent Number: 4,814,288
[45] Date of Patent: Mar. 21, 1989

[54] METHOD OF FABRICATING SEMICONDUCTOR DEVICES WHICH INCLUDE VERTICAL ELEMENTS AND CONTROL ELEMENTS

[75] Inventors: Masatoshi Kimura, Ome; Takeaki Okabe; Isao Yoshida, both of Tokyo; Kouzou Sakamoto, Nerima; Kazuo Hoya, Takasaki; Kouichiro Satonaka, Maebashi; Toyomasa Koda; Shigeo Ohtaka, both of Takasaki, all of Japan

[73] Assignee: Hitachi, Ltd., Tokyo, Japan

[21] Appl. No.: 72,164

[22] Filed: Jul. 10, 1987

[30] Foreign Application Priority Data

Jul. 14, 1986 [JP] Japan .................................. 61-163739

[51] Int. Cl.⁴ .................... H01L 21/20; H01L 21/302
[52] U.S. Cl. ........................................ 437/59; 437/31; 437/61; 437/97
[58] Field of Search .............. 437/59, 78, 917, 31, 437/97, 61; 148/DIG. 50; 357/23.4, 40

[56] References Cited

U.S. PATENT DOCUMENTS

| | | | |
|---|---|---|---|
| 3,764,409 | 10/1973 | Nomura et al. | 437/78 X |
| 3,885,999 | 5/1975 | Fusaroli et al. | 437/917 X |
| 3,925,120 | 12/1975 | Saida et al. | 437/78 X |
| 4,089,021 | 5/1978 | Sato et al. | 148/DIG. 50 |
| 4,311,532 | 1/1982 | Taylor | 437/59 X |
| 4,403,395 | 9/1983 | Curran | 437/59 X |
| 4,420,700 | 12/1983 | Fay et al. | 307/571 |
| 4,497,106 | 2/1985 | Momma et al. | 437/59 |
| 4,559,694 | 12/1985 | Yoh et al. | 437/59 X |

Primary Examiner—Brian E. Hearn
Assistant Examiner—Tom Thomas
Attorney, Agent, or Firm—Antonelli, Terry & Wands

[57] ABSTRACT

A method of fabricating semiconductor devices which include vertical elements and control elements. A well is formed by etching in a semiconductor substrate of a first conductivity type, and a first epitaxial layer having a second conductivity type opposite to the first conductivity type is epitaxially grown, followed by etching and/or grinding and/or polishing to fill said well. Further, a second epitaxial layer of the first conductivity type is epitaxially grown on the substrate and on the first epitaxial layer, and an impurity-doped layer of the second conductivity type for isolation is formed in the second epitaxial layer to penetrate therethrough. A first element is formed in the second epitaxial layer in a portion that corresponds to the well, and a second element having a vertical structure and having a current capability higher than that of the first element is formed except a portion of the second epitaxial layer that corresponds to the well.

26 Claims, 8 Drawing Sheets

METHOD OF FABRICATING SEMICONDUCTOR DEVICES WHICH INCLUDE VERTICAL ELEMENTS AND CONTROL ELEMENTS

BACKGROUND OF THE INVENTION

The present invention relates to a method of fabricating semiconductor devices which is suited for integrating a vertical power transistor and control devices under optimal conditions for each device structure.

A semiconductor device in which a vertical power MOS transistor, logic and/or small-signal control circuits coexist, has been disclosed in Electronic Design, "Mixed MOS Devices Unite in a Switch Chip that Links Power with Smarts", Feb. 21, 1985, pp. 191-198.

FIG. 1 is a section view of this semiconductor integrated circuit, wherein reference numeral 21 denotes an n+-type semiconductor substrate, 122 denotes a p-type epitaxial layer, 23 denotes an n-type epitaxial layer, 24 denotes a vertical power MOSFET, 25 denotes a portion of control devices, 26 denotes an n+-type buried layer, and 27 denotes a p+-type isolation diffusion layer.

Studying the above prior art, however, the present inventors have found problems as described below.

That is, according to the prior art as shown in FIG. 1, the drain electrode of the power MOSFET 24 is drawn from the underlying n+-type substrate 21 via the heavily doped n+-type buried layer 26 that is formed deep to penetrate through the p-type epitaxial layer 122. However, since the portion 25 of control devices consisting of CMOS logic circuitry and small-signal circuits, has not been provided with the n+-type buried layer, there arise problems as follows:

(1) Collector series resistance increases in the portion of control devices;
(2) Latch-up hardness of CMOS decreases; and
(3) Electric current leaks into the substrate due to the increase of current gain $h_{FE}$ of a parasitic vertical pnp transistor.

Further, the n-type epitaxial layer 23 has the same thickness in the vertical device portion where the power MOSFET 24 is formed and in the control device portion 25 where the CMOS logic circuitry and small-signal circuit are formed. Coexistence of the power MOSFET 24 makes the n-type epitaxial layer 23 thick even in the portion 25 of control devices where the n-type epitaxial layer needs not have an increased thickness. Because of this, the following additional problem arises (4) Deep p+-type isolation layers 27 are required causing the characteristics of the portion 25 of control devices to be deteriorated.

In order for a power MOSFET 24 to deliver a high current at a low resistance, a deep highly doped n+-type penetration layer 26 must be formed to penetrate through the p-type epitaxial layer 22. In forming the p+-type isolation diffusion layers 27, furthermore, impurities diffuse up from the n+-type penetration layer 26 into the n-type epitaxial layer 23 so that its thickness decreases substantially. Therefore, antimony ions having a small coefficient of diffusion are usually used as impurities for the n+-type penetration layer 26. The diffusion must be effected at 1200° C. for as long as 15 hours even when the n+-type diffusion layer 26 is to be formed maintaining a thickness of about 7 μm. To form the n+-type penetration layer 26 maintaining a thickness of greater than 10 μm, therefore, the diffusion must be carried out at a temperature of as high as 1200° C. for a period of as long as 24 hours or more.

According to the conventional art, as described above, the diffusion must be effected at a high temperature for an extended period of time, resulting in an increase in the manufacturing time and cost. Further, since the n+-type penetration layer 26 expands in the lateral direction, an increased area is required. Moreover, crystallinity of the semiconductor (silicon) is disturbed by the heat-treatment that is effected for an extended period of time to form the n+-type penetration layer 26, causing the transistor to generate noise and causing the yield to decrease.

SUMMARY OF THE INVENTION

A semiconductor device fabricated according to the present invention comprises a first epitaxial layer which is buried in a semiconductor substrate of a first conductivity type, the first epitaxial layer having a second conductivity type opposite to the first conductivity type; a second epitaxial layer of the first conductivity type formed on the substrate and on the first epitaxial layer; and an impurity-doped layer for isolation of the second conductivity type that penetrates through the second epitaxial layer.

A method of fabricating semiconductor devices according to the present invention comprises a step for forming a well by etching in a semiconductor substrate of a first conductivity type; a step for epitaxially growing a first epitaxial layer having a second conductivity type opposite to the first conductivity type to fill up said well; a step for epitaxially growing a second epitaxial layer of the first conductivity type on the substrate and on the first epitaxial layer; and a step for forming an impurity-doped layer for isolation of the second conductivity type in the second epitaxial layer to penetrate therethrough.

That is, according to the present invention in which the epitaxial layer of the second conductivity type is buried in the substrate of the first conductivity type, a vertical power transistor portion can be fabricated with an optimum lightly doped first conductivity-type substrate/heavily doped first conductivity-type substrate structure (n−/n+ type substrate structure) like discrete devices despite the coexistence of control devices, without requiring great modification and without the need of forming a deep first conductivity-type penetration layer (n+-type penetration diffusion layer 26) that is required in the prior art as shown in FIG. 1. Moreover, a shallow heavily doped buried layer of the first conductivity type can be formed on the surface of the first epitaxial layer of the portion of control devices isolated from the vertical power transistor by the impurity-doped layer for isolation. Therefore, there can be constituted favorable bipolar small-signal devices and CMOS circuitry. In particular, various protection circuits for controlling power MOSFET's such as thermal shut-down circuit, overvoltage protection circuit, overcurrent protection circuit and temperature compensation circuit, can be constituted by using bipolar transistors having good characteristics. Therefore, the elements adapted to fulfilling such purposes can be made present together with the power MOSFET on the same chip.

Furthermore, the above-mentioned object can be achieved by the structure described below. That is, the object is achieved by a semiconductor device comprising a first epitaxial layer which is grown on a semiconductor substrate of a first conductivity type and which has a second conductivity type opposite to the first conductivity type; a second epitaxial layer of the first conductivity type which is provided on said substrate or on said first epitaxial layer of a portion from where said first epitaxial layer has been removed and on said first epitaxial layer; and an impurity-doped layer for isolation of the second conductivity type provided to penetrate through the second epitaxial layer.

A method of fabricating semiconductor devices of the above structure comprises a step for epitaxially growing a first epitaxial layer of a second conductivity type on a semiconductor substrate of a first conductivity type, the second conductivity type being opposite to the first conductivity type; a step for forming a well by etching in the first epitaxial layer, said well being deep or penetrating through the first epitaxial layer; a step for epitaxially growing a second epitaxial layer of the first conductivity type on said substrate or on said first epitaxial layer of a portion exposed by etching and on said first epitaxial layer; and a step for forming an impuritydoped layer for isolation of the second conductivity type in said epitaxial layer to penetrate therethrough That is, by forming a well by etching in the first epitaxial layer in a portion where a vertical power transistor is to be formed, the second epitaxial layer of the first conductivity type can be easily connected to the substrate of the first conductivity type without the need of forming a deep impurity-doped layer of the first conductivity type ($n^+$-type buried layer 26 of FIG. 1) that was formed in the prior art, and the thickness of the second epitaxial layer can be changed depending upon the portion of the vertical power transistor and the portion of control devices. In order to increase the breakdown voltage, a thick epitaxial layer can be easily formed for the portion of the vertical device independently of the portion of the control devices. Furthermore, the heavily doped layer for isolation may be comprised of a thin epitaxial layer of the first conductivity type formed on the second epitaxial layer without increasing the area despite the increase in the isolation voltage. The portion of control devices is formed in the second thin epitaxial layer and the heavily doped buried layer of the first conductivity type is also formed therein. Therefore, device characteristics of the portion of control devices are not deteriorated despite the coexistence of the high-voltage device. In particular, bipolar transistors are more suited than MOS transistors for constituting a variety of protection circuits that control power MOSFET's, such as overcurrent protection circuit, overvoltage protection circuit and thermal shutdown circuit. The elements that are best suited for fulfilling such an object can be made present together with a power MOSFET on the same chip.

The object of the present invention is to arrange a high-current power transistor (vertical transistor) and control devices (small-signal control circuit for the high-current power transistor) on the same chip under optimal conditions for each device structure.

Another object of the present invention is to shorten the fabrication time in forming the high-current vertical power transistor and control devices on the same chip.

These and other objects and many of the attendant advantages of this invention will be readily appreciated as the same becomes better understood by reference to the following detailed description when considered in connection with the accompanying drawings.

DETAILED DESCRIPTION OF THE INVENTION

An embodiment of the invention will now be described in conjunction with FIG. 2. Described here in an IC structure in which a high-current vertical power MOSFET of the class of 20 A/60 V and small-signal bipolar transistors having an breakdown voltage about 5 volts coexist.

Figure 2:
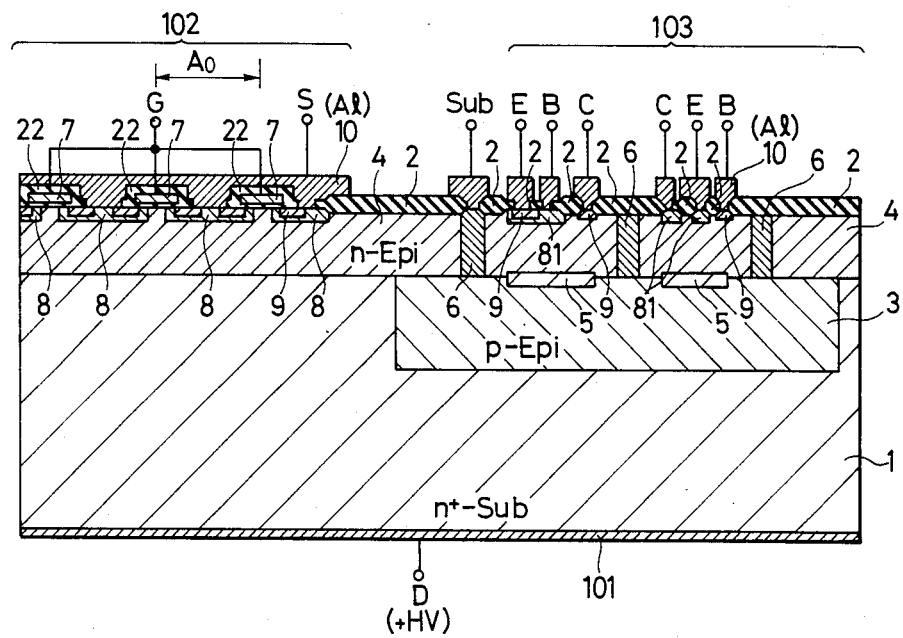
FIGS. 2 to 3A are section views illustrating a first embodiment of the present invention.

In FIG. 2, reference numeral 1 denotes an $n^+$-type silicon substrate, 2 denotes an oxide film, 3 denotes a p-type epitaxial layer buried in a well formed in the $n^+$-type substrate 1, reference numeral 4 denotes an n-type epitaxial layer formed on the $n^+$-type substrate 1 and on the p-type epitaxial layer 3, reference numeral 5 denotes a shallow $n^+$-type buried diffusion layer formed in the surface of the p-type epitaxial layer 3 in the portion of low-voltage devices, 6 denotes a p-type diffusion layer for isolation which penetrates through the n-type epitaxial layer 4 on the p-type epitaxial layer 3, reference numeral 102 denotes a portion of a high-voltage device, 103 denotes a portion of low-voltage devices, 7 denotes a polycrystalline silicon gate electrode, 8 denotes a p-type well, 81 denotes a p-type diffusion layer, 9 denotes an $n^+$-type diffusion layer, 10 denotes an aluminum wiring layer 22 denotes an oxide film, and 101 denotes a metal electrode.

To obtain a vertical power MOSFET of a 60 volt class, the $n^-$-type epitaxial layer 4 must have a resistivity of 0.8 ohm.cm and a thickness of about 10 µm. To decrease the series resistance, use is made of the $n^+$-type substrate 1 having a resistivity of smaller than 0.02 ohm.cm. To obtain a current as great as 20 amperes, unit cells of MOSFET's (having a pitch of about 30 µm) should be arranged in a number of about 5,000 with the cell pitch $A_0$ as a unit.

First, a portion of the $n^+$-type substrate 1 where low-voltage devices, i.e., small-signal circuits are to be formed, is removed by etching by a depth of about 15 to 20 µm, and the p-type epitaxial layer 3 is buried by the epitaxial growing method. Thereafter, $n^+$-type buried layers 5 for small-signal circuitry are formed at predetermined positions by the diffusion method, and the $n^-$-type epitaxial layer 4 is grown on the $n^+$-type substrate 1 and on the p-type epitaxial layer 3. Then, the p-type diffusion layers 6 for isolation are formed in the $n^-$-type epitaxial layer 4 by the diffusion method. In this case, the isolation voltage of greater than 60 volts must be maintained with respect to the portion of power MOSFET. When a high voltage is applied to the drain of the power MOSFET, the depletion layer extends in the $n^-$-type epitaxial layer 4 in the portion of power MOSFET and in the buried p-type epitaxial layer 3. To obtain the isolation voltage of about 70 to 80 volts to maintain a margin, the p-type epitaxial layer 3 must have a resistivity of greater than at least 2.5 ohm.cm. When a voltage of 80 volts is applied to the drain of the power MOSFET, the depletion layer that extends in the p-type epitaxial layer 3 has a thickness of about 5 μm by the abrupt junction approximation. If the depth of diffusion of the n+-type buried layer is 5 μm, the p-type epitaxial layer 3 for isolation must have a thickness of greater than 10 μm. By taking the up-diffusion of impurities from the n+-type substrate 1 into consideration, the p-type epitaxial layer 3 should be about 15 to 20 μm thick.

Figure 1:
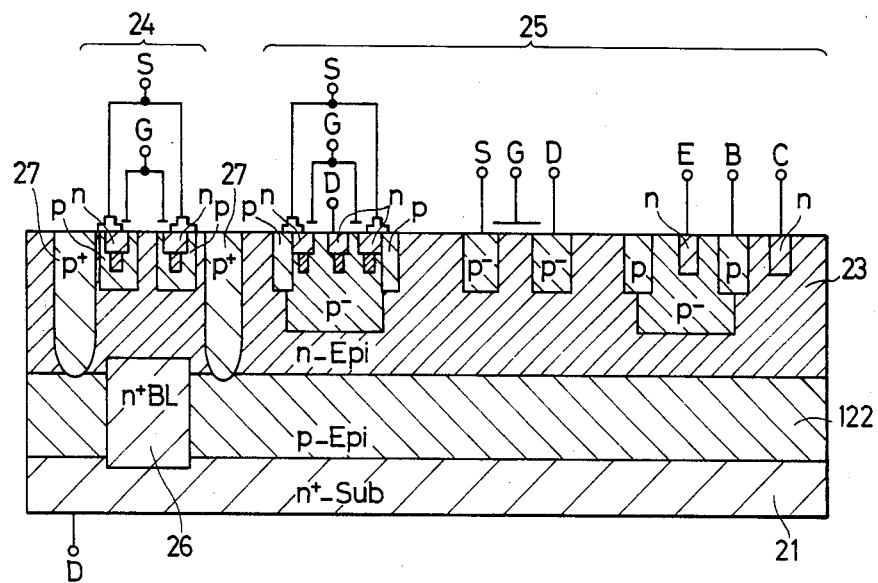
FIG. 1 is a section view showing the conventional technology.

According to the conventional technology shown in FIG. 1 as described earlier, the step of diffusion must be carried out at a high temperature for an extended period of time to form a deep n+-type penetration layer. According to the present invention, a deep well is formed by etching in the n+-type substrate 1 of a portion where a small-signal circuitry is to be formed, and the p-type epitaxial layer 3 for isolation is buried in the well. Unlike the conventional technology shown in FIG. 1, therefore, there is no need of forming a heavily doped deep n+-type penetration layer 26: the drain electrode of the vertical power MOSFET can be iirectly taken out from the n+-type substrate 1. Furthermore, the n+-type buried layer 5 that is used for an ordinary bipolar IC can be easily formed for the portion of small-signal circuitry without at all adversely affecting the portion of power MOSFET.

After the diffusion layers 6 for isolation are formed, a small-signal bipolar control circuit is formed in the region where the p-type epitaxial layer 3 is buried, and a vertical power MOSFET is formed in the portion of the n−/n+-type substrate.

According to this embodiment, the vertical power MOSFET can be realized in the n−/n+-type substrate structure like a vertical power MOSFET of a discrete element, and a small-signal circuitry can be realized in the form of an IC equipped with the n+-type buried layer, making it possible to obtain an optimal device structure in the same chip.

To increase the isolation voltage of the portion the MOSFET, the n−-type epitaxial layer and the p-type epitaxial layer 3 usually must have a low impurity concentration, and the small-signal transistors to be coexistent therewith must be formed in the n−-type epitaxial layer having a high resistivity. This increases the series resistance of a collector and decreases the frequency response and current capability. With the structure of the present invention, however, the n+-type buried layer 5 can be used for the portion of small-signal circuitry even when it is attempted to increase the breakdown voltage of the portion of power MOSFET as described above, and the performance is deteriorated little.

The n+-type buried layer 5 provided for the portion of small-signal circuitry is also effective to prevent punch through between the base of the npn bipolar transistor and the p-type epitaxial layer 3, and further helps decrease the current amplification factor $h_{FE}$ of the parasitic substrate pnp transistor in the case of the lateral pnp transistor.

Figure 3A:
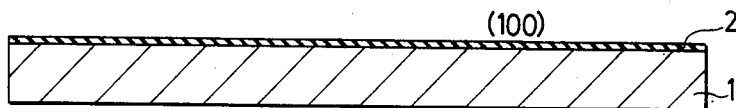

A method of fabricating a semiconductor device of the structure shown in FIG. 2 will now be described in conjunction with FIGS. 3A to 3I. Referring, first, to FIG. 3A, the surface of the n+-type (100) is silicon substrate 1 having a resistivity of smaller than 0.02 ohm.cm is oxidized to form an oxide film 2, by the thermal oxidation in a wet oxygen atmosphere at a temperature of 1100° C. for 120 minutes.

Figure 3B:
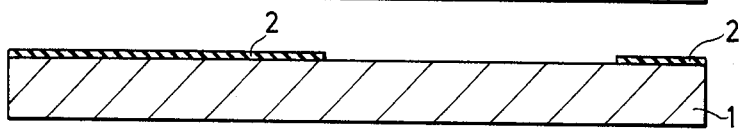

Referring to FIG. 3B, the oxide film is removed by photoetching from a region where a small-signal control circuit is to be formed. In this case, the photomask has a rectangular pattern in parallel with the direction <100>.

Figure 3C:
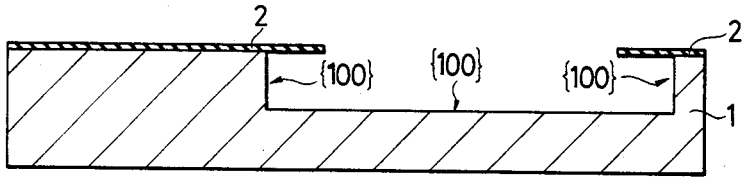

Referring next to FIG. 3C, a well of a depth of about 15 to 20 μm is formed in the substrate by anisotropic etching effected by using, for example, an aqueous solution containing 40% by weight of KOH at a temperature of 70° C. with the oxide film 2 as a mask.

Figure 3D:
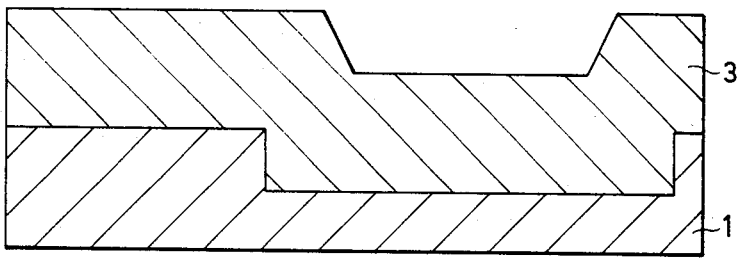

Then, as shown in FIG. 3D, the oxide film 2 is removed, and the p-type epitaxial layer 3 is formed maintaining a thickness greater than the depth of the well.

Figure 3E:
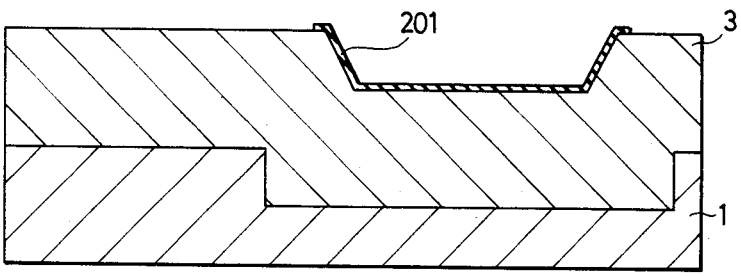

Thereafter, the surface of the p-type epitaxial layer 3 is oxidized in a wet oxygen atmosphere at 1100° C. for 120 minutes, followed by photoetching such that an oxide film 201 is left as shown in FIG. 3E.

Figure 3F:
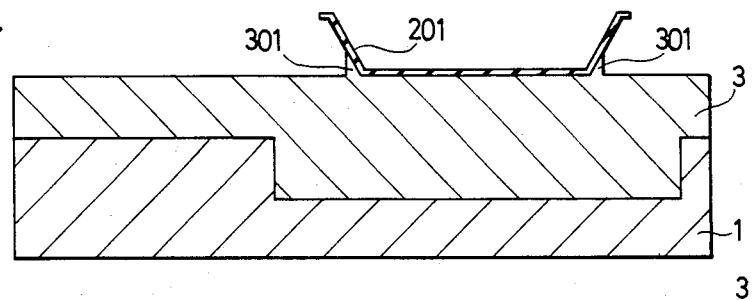

With reference to FIG. 3F, anisotropic etching is effected again using the KOH aqueous solution and the oxide film 201 as a mask, so that the lower surface of the oxide film 201 is nearly in agreement with the surface of the etched silicon (surface of the p-type epitaxial layer 3).

Figure 3G:
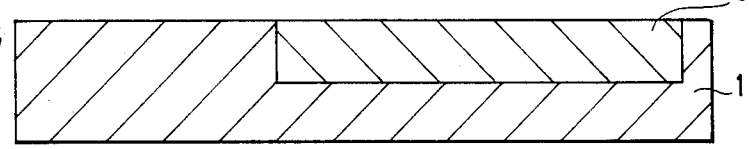

After the oxide film 201 is removed, in order to remove the small protrusions 301 left on the silicon surface and have the surface of the n+-type substrate 1 exposed, furthermore, the whole surface is polished as finely as a mirror surface or is subjected to etching using a KOH aqueous solution. This makes it possible to form a structure in which the p-type epitaxial layer 3 is buried in the n+-type substrate 1 as shown in FIG. 3G.

Figure 3H:
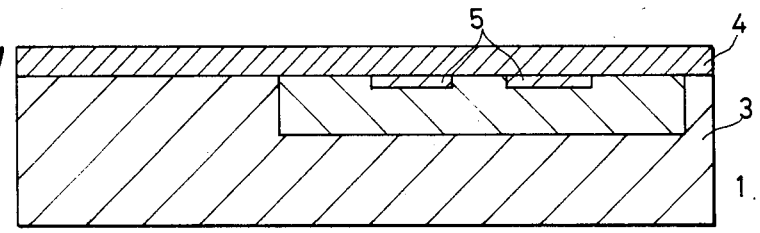

With reference to FIG. 3H, the n+-type buried layers 5 are formed by the diffusion method in the portion where transistors of a small-signal circuit are to be formed, and then the n−-type epitaxial layer 4 is grown on the surface of the silicon. When a power MOSFET of a 60 volt class is to be fabricated, the n−-type epitaxial layer 4 having a resistivity of 0.8 ohm.cm should be grown maintaining a thickness of 10 μm.

Figure 3I:
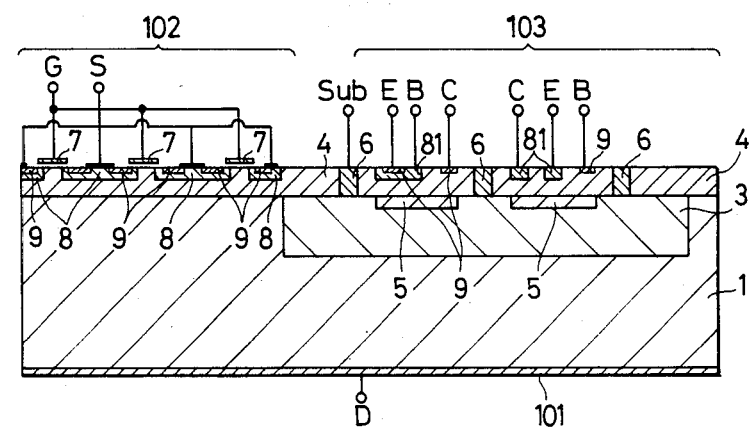

Then, as shown in FIG. 3I, the p-type diffusion layers 6 for isolation are formed, and a vertical power MOSFET is formed in the n−/n+-type substrate portion and small-signal bipolar transistors are formed in the n−/p−/n+-type substrate portion by a known method, thereby to fabricate the semiconductor device of the present invention shown in FIG. 2.

Figure 4:
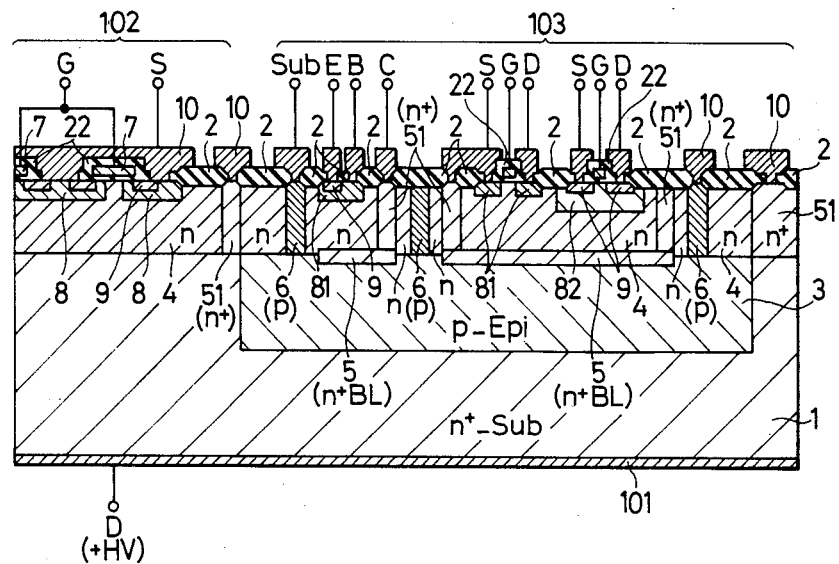
FIG. 4 is a section view illustrating a second embodiment of the present invention.

FIG. 4 is a section view which illustrates a semiconductor device according to another embodiment of the present invention. In this embodiment, there are made present together a vertical power MOSFET and a CMOS logic circuit in addition to bipolar transistor, in the portion of the control circuitry. A p-type diffusion layer 82 is introduced to realize an n-channel MOSFET for the CMOS logic circuit. An n+-type diffusion layer 51 is provided between the portion of power MOSFET and the p-type diffusion layer 6 for isolation. This makes it possible to prevent the generation of a parasitic channel in the portion of the MOSFET and in the portion of low-voltage devices even when a p-type inverted layer is formed by the floating charge. In particular, in the case of the high-side switch in which a potential higher than the potential (most negative voltage) of the diffusion layer 6 for isolation is applied to the source of the power MOSFET, a parasitic MOS transistor easily develops. Therefore, provision of the n+-type diffusion layer 51 is very effective to prevent the channel from developing. The n+-type diffusion layer, 51 is also effective for preventing the depletion layer, that extends from the diffusion layer 6 for isolation, from punching through to the source of the power MOSFET.

Owing to the provision of n+-type diffusion layers 51 in the collettor portions of small-signal npn bipolar transistors, the collector series resistance can be decreased despite the high resistivity of the epitaxial layer 4 maintaining the high breakdown voltage of the of power MOSFET. Thus the characteristics of the small-signal portion are not deteriorated. Furthermore, the CMOS logic portion is surrounded by the n+-type buried layer 5 and the n+-type diffusion layer 51 to decrease the series resistance. This helps solve the problem in that latch-up easily takes place due to increased resistivity of the n-type epitaxial layer 4 since there also exists the high-voltage power MOSFET.

Figure 5:
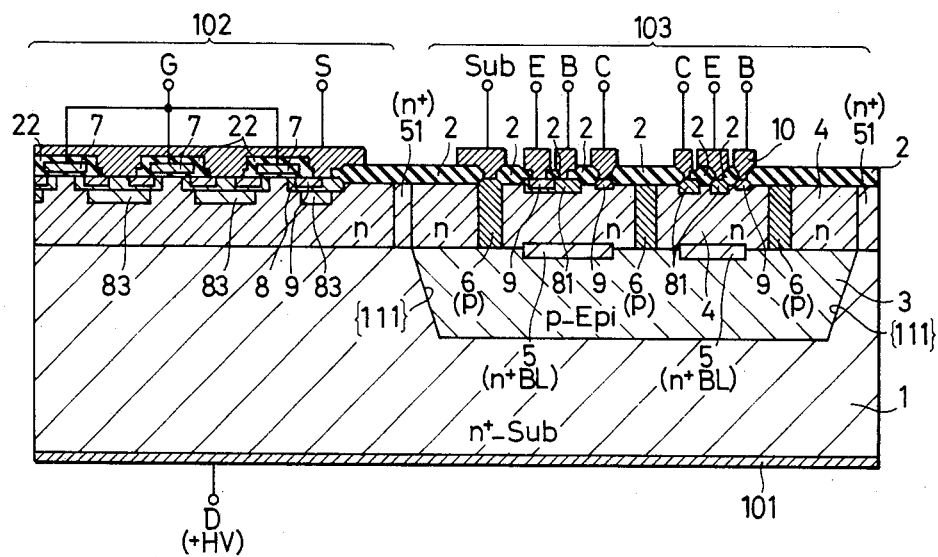
FIG. 5 is a section view illustrating a third embodiment of the present invention.

FIG. 5 is a section view which illustrates another embodiment of the present invention wherein there are provided p-type diffusion layers 83 deeper than the p-type layers 8 to increase the breakdown voltage of the portion of power MOSFET. As for the well for forming a p-type epitaxial buried layer 3 in the control device portion, the etching pattern is not set to be in parallel with the direction <100> that was done in the fabrication method of FIGS. 3A to 3I, but is set to be in parallel with the direction <110>. Side surfaces of the well are surrounded by the planes (111). Even in this case, the portion of power MOSFET and the portion of control circuit can be arranged together under the optimal conditions for the device structures as described in the embodiment of FIG. 2.

Figure 6:
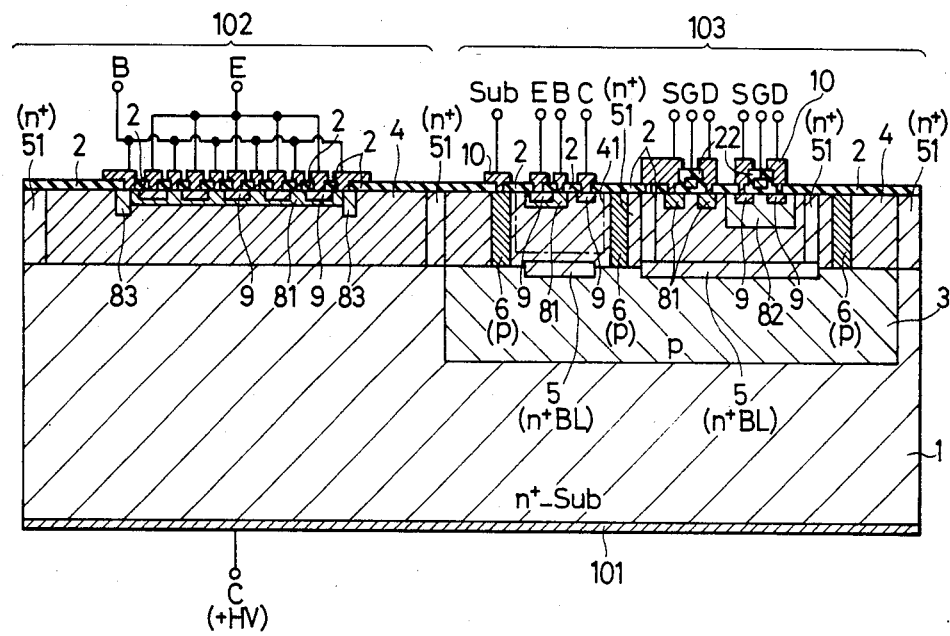
FIG. 6 is a section view illustrating a fourth embodiment of the present invention.

FIG. 6 is a section view which illustrates a further embodiment of the present invention wherein a power npn transistor is made present instead of the power MOSFET. Like in the case of a power npn transistor of a discrete device, a high current is taken out from the n+-substrate, and a circuit for controlling the power transistor is fabricated in a region surrounded by the p-type buried epitaxial layer 3 and the p-type diffusion layer 6 for isolation. When a npn power transistor of the 60 volt class is to be fabricated, for example, the n-type epitaxial layer 4 will have a resistivity of as great as 7 ohm.cm and a thickness of as large as 15 μm. By forming the n+-type buried layer 5 in the control device portion, therefore, the series resistance can be decreased, so that characteristics of the low-voltage devices are not deteriorated by the coexistance of the high-voltage power npn transistor. The resistance of the low-voltage portion can further be decreased effectively by the formation of an n-type well layer 41 as indicated by a dot-dash line in FIG. 6.

Described below is an embodiment to achieve the object of the present invention.

Figure 7:
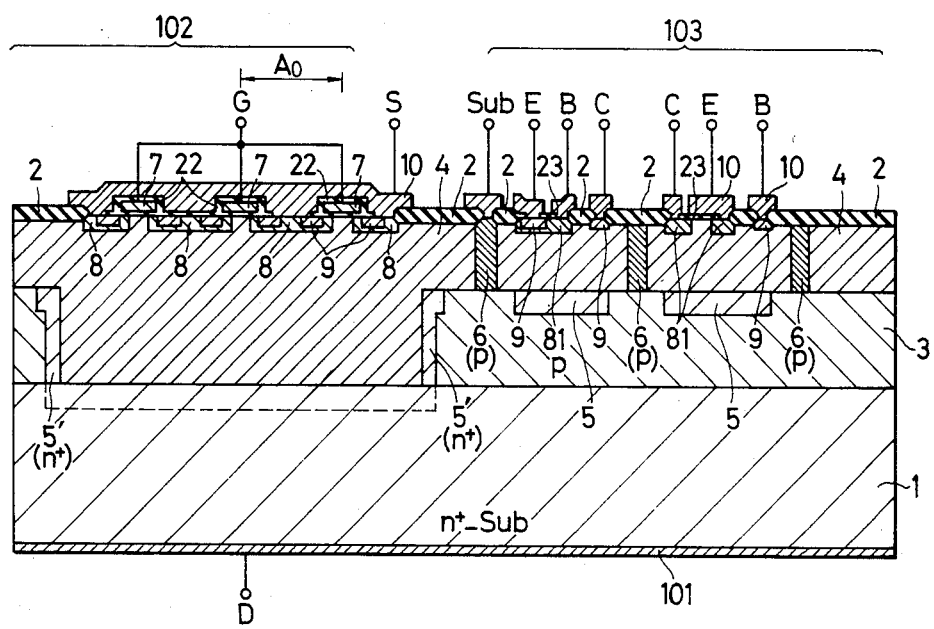
FIGS. 7 and 8A to 8H are section views illustrating a fifth embodiment of the present invention.

FIG. 7 is a section view of a semiconductor device according to this embodiment which deals with the IC structure that contains a vertical power MOSFET of the 10 A/200 V class and small-signal bipolar transistors having a breakdown voltage of about 5 volts.

In FIG. 7, reference numeral 1 denotes an n+-type silicon substrate, 2 denotes an oxide film, 3 denotes a p-type epitaxial layer formed on the n+-type silicon substrate 1, reference numeral 4 denotes an n-type epitaxial layer formed on the substrate of a portion from where the p-type epitaxial layer 3 has been removed and formed on the p-type epitaxial layer 3, reference numerals 5 and 5' denote n+-type buried layers, 6 denotes a p-type diffusion layer for isolation that penetrates through the n-type epitaxial layer 4, reference numeral 102 denotes a portion of high-voltage device, 103 denotes a portion of low-voltage devices, 7 denotes polycrystalline silicon gate electrodes, 8 denotes p-type wells, 81 denotes p+-type diffusion layers, 9 denotes n+-type diffusion layers, 10 denotes aluminum electrodes, and 101 denotes a metal electrode.

To obtain a vertical power MOSFET of the 200 volt class, the n-type epitaxial layer 4 must have a resistivity of 4 ohm.cm and a thickness of about 25 μm. To decrease the series resistance, use is made of the n+-type substrate 1 having a resistivity of smaller than 0.02 ohm.cm. To obtain a current as great as 10 amperes, unit cells of MOSFET's (having a pitch of about 30 μm) should be arranged in a number of about 5000 with the cell pitch $A_O$ as a unit.

First, the p-type epitaxial layer 3 is epitaxially grown on the n+-type substrate 1 and is then removed by etching from a portion where a high-voltage power transistor is to be formed. In this case, the n+-type substrate 1 may be over-etched to some extent. Thereafter, the n+-type buried layers 5, 5' for low-voltage devices are formed in predetermined position by the diffusion method and, then, the n-type ppitaxial layer 4 is grown thereon. The n+-type buried layer 5' need not necessarily be formed in a portion from where the p-type epitaxial layer 3 is removed by etching and where the high-voltage device is to be formed. If the surface is flattened, the n-type epitaxial layer 4 has an increased thickness in the high-voltage portion and has a reduced thickness in the low-voltage portion.

Next, the p-type diffusion layer 6 for isolation is formed in the thin n-type epitaxial layer 4 on the p-type epitaxial layer 3. In this case, the isolation voltage must be greater than 200 volts with respect to the portion of the power MOSFET. When a high voltage is applied to the drain of the power MOSFET, the depletion layer extends in the n-type epitaxial layer 4 and in the p-type epitaxial layer 3 in the portion of the power MOSFET. To obtain an isolation voltage of about 220 volts maintaining a margin, the p-type epitaxial layer 3 must have a resistivity of at least greater than 12 ohm.cm. When a voltage of 220 volts is applied to the power MOSFET, the depletion layer that extends in the p-type epitaxial layer 3 has a thickness of about 14.8 μm by abrupt junction approximation. Therefore, with the p-type epitaxial layer 3 being 20 μm in thickness, the isolation voltage can be sufficiently maintained even when the n+-type buried layer 5 has a diffusion depth of 5 μm.

The n-type epitaxial layer 4, on the other hand, has a thickness of greater than about 25 μm in the high-voltage portion and a thickness of about 10 μm at the greatest in the low-voltage portion. Therefore, the p-type diffusion layer 6 for isolation needs have a thickness as small as about 10 to 12 μm. Therefore, the area can be reduced greatly compared with the conventional structure which requires the p-type diffusion layer having a depth of greater than 25 μm to isolate the n-type epitaxial layer which has a uniform thickness of as great as 25 μm.

Unlike the conventional art, furthermore, a deep n+-type penetration layer (layer 26 of FIG. 1) is not required, but the n+-type buried layer having a thickness of about 5 μm, that is used in an ordinary IC, is used, obviating the need of effecting the step of diffusion at a high temperature for an extended period of time. Therefore, it is possible to solve such problems as the increase in the fabrication time and in the manufacturing cost, increase in the area due to the extension of the diffusion layer in the lateral direction, generation of noise in the transistor caused by the disturbance in the semiconductor crystal, and decrease of the yield.

According to this embodiments as described above, the drain electrode of the vertical MOSFET can be drawn from the n+-type substrate without the need of forming a heavily doped n+-type diffusion layer that was required in the conventional art. Furthermore, the n+-type buried layer used in an ordinary bipolar IC can be easily formed in the portion of small-signal circuits without affecting the portion of the MOSFET.

After the diffusion layer 6 for isolation is formed, a small-signal bipolar control circuit is formed in an island isolated by the diffusion layer 6 in the n-type epitaxial layer 4 on the p-type epitaxial layer 3, and a vertical power MOSFET is formed in a portion of the n−/n+ type substrate (portion from where the p-type epitaxial layer 3 is removed by etching).

That is, according to this embodiment, the vertical power MOSFET is realized in the n−/n+-type substrate structure like the vertical power MOSFET of a discrete device, a small-signal control circuit is realized in the IC structure equipped with n+-type buried layer 5, and there is formed the n-type epitaxial layer 4 having a thickness that changes to eeet the breakdown voltages of the devices. Therefore, devices can be formed in the same chip under optimal conditions.

According to the conventional structure, the small-signal transistors are formed in an n-type epitaxial layer that has a large thickness to meet the portion of the power MOSFET. Therefore, there arise such problems as increase in the area due to increased depth of a diffusion layer for isolation, decrease of frequency response due to the increase in the collector series resistance, and decrease in the current capability. According to the structure of the present invention, however, thickness of the n-type epitaxial layer 4 can be decreased in the small-signal portion even when it is attempted to increase the breakdown voltage in the portion of power MOSFET, and it is also allowed to form the n+-type buried layer 5. Therefore, characteristics of the small-signal transistors deteriorate very little.

Moreover, the n+-type buried layer 5 formed in the small-signal portion is effective to suppress the punch through between the base of the npn transistor and the p-type epitaxial layer 3, and further helps decrease the current amplification factor $h_{FE}$ of a parasitic substrate pnp transistor in the case of the lateral pnp transistor.

Figure 8A:
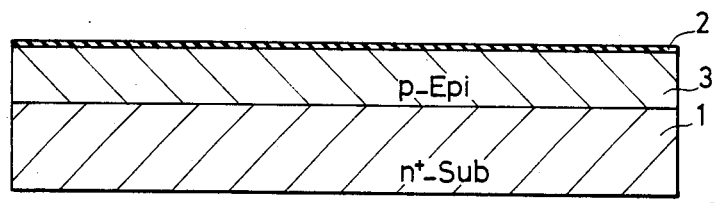

A method of fabricating the structure of the embodiment of FIG. 7 will be described below in conjunction with FIGS. 8A to 8H. Referring, first, to FIG. 8A, a p-type epitaxial layer 3 is grown on an n-type (100) silicon substrate 1 having a resistivity smaller than 0.02 ohm.cm at a temperature of 1100° C. for 30 minutes and, then, the surface thereof is oxidized to form an oxide film 2. When a power MOSFET of, for example, 200 volts is to be formed together therewith, the p-type epitaxial layer 3 must have a resistivity of greater than 12 ohm.cm and a thickness of about 20 μm.

Figure 8B:
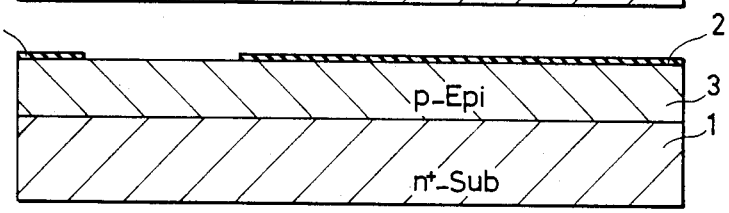

Then, as shown in FIG. 8B, the oxide film is removed by photoetching from a region where a power MOSFET is to be formed. In this case, the photomask has a rectangular pattern in parallel with the direction <100>.

Figure 8C:
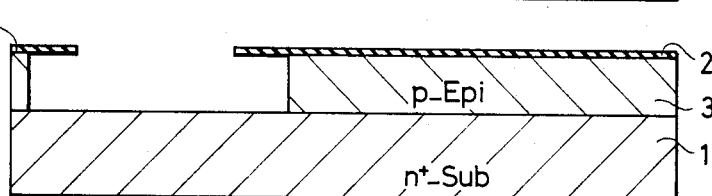

Referring to FIG. 8C, the p-type epitaxial layer 3 is removed by anisotropic etching using an aqueous solution containing 40% by weight of KOH at 70° C. with the oxide film 2 as an etching mask. Here, the n+-type substrate 1 may be overetched to some extent.

Figure 8D:
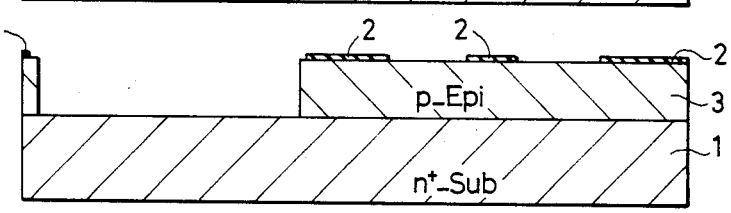

Referring to FIG. 8D, windows are formed by photoetching to form an n+-type diffusion layer in a portion where transistors of the small-signal circuit are to be formed. The n+-type buried layer may enter into the high-voltage portion. Therefore, the oxide film 2 of FIG. 8C may be used as a mask for forming the n+-type buried layer.

Figure 8E:
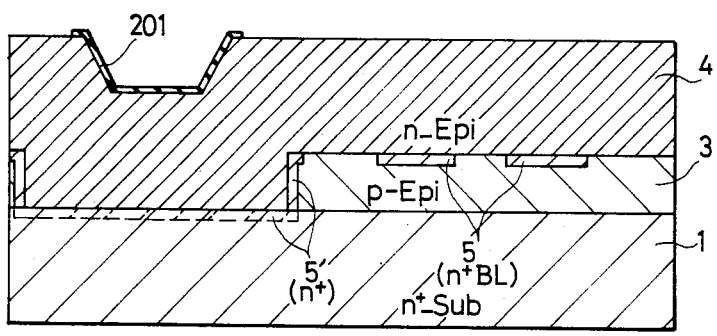

Referring to FIG. 8E, after the n+-type buried layer 5 has been formed, the n-type epitaxial layer 4 is grown maintaining a thickness greater than the depth of the well formed in the p-type epitaxial layer 3 in the step of FIG. 8C. Then, the surface is oxidized followed by photoetching so that an oxide film 201 is left.

Figure 8F:
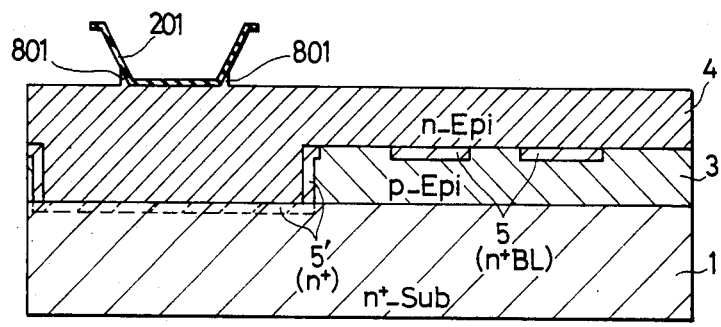

Then, as shown in FIG. 8F, the anisotropic etching is effected again using the aqueous solution containing 40% by weight of KOH with the oxide film 201 as a mask, so that the lower surface of the oxide film 201 becomes in agreement with the surface of the n-type epitaxial layer 4 that is etched.

Figure 8G:
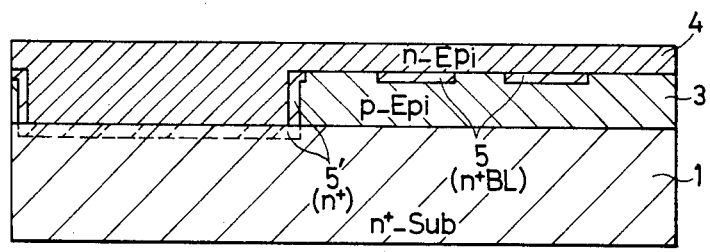

Referring to FIG. 8G, after the oxide film 201 is removed, then the whole surface is polished as finely as a mirror surface or is further etched using the KOH aqueous solution so that the small protrusions 801 left on the n-type epitaxial layer 4 are removed and the n-type epitaxial layer 4 has a predetermined thickness. Therefore, the n-type epitaxial layer 4 is formed maintaining a large thickness on the n+-type substrate 1 and maintaining a small thickness on the p-type epitaxial layer 3 on the n+-type substrate 1, with n+-type buried layers 5 being contained therein. For example, when the power MOSFET of 200 volts is to be made present together therewith, the n-type epitaxial layer 4 should have a resistivity of about 4 ohm.cm and a thickness of greater than 25 μm in the high-voltage portion and a thickness of about 10 μm at the greatest in the low-voltage portion.

Figure 8H:
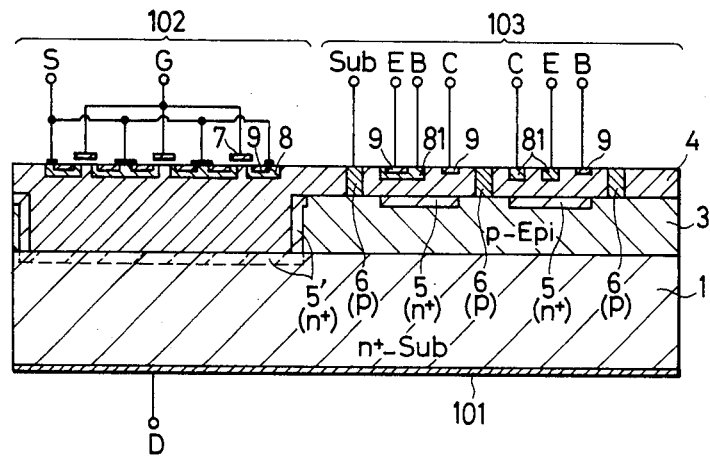

Then, as shown in FIG. 8H, the p-type diffusion layer 6 is formed to penetrate through the thin n-type epitaxial layer 4, a vertical power MOSFET is formed in the portion of the thick n-type epitaxial layer 4, and small-signal bipolar transistors are formed by a known method in the portion of the thin n-type epitaxial layer 4, thereby to obtain the semiconductor device shown in FIG. 7.

FIGS. 9A to 9E are section views illustrating fabrication steps according to a further embodiment. Namely, FIGS. 9A to 9E illustrate a method of fabricating a semiconductor device in which are arranged a vertical power MOSFET and bipolar transistors as well as a CMOS logic circuit in the portion of low-voltage control circuitry. cuitry.

Figure 9A:
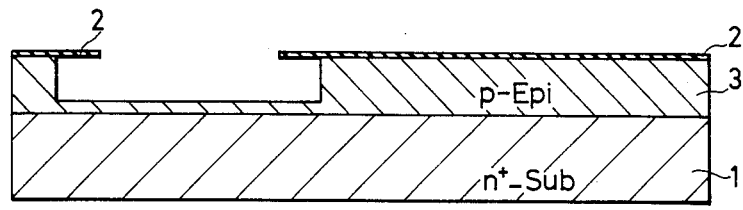
FIGS. 9A to 9E are section views illustrating a sixth embodiment of the present invention.
Figure 9B:
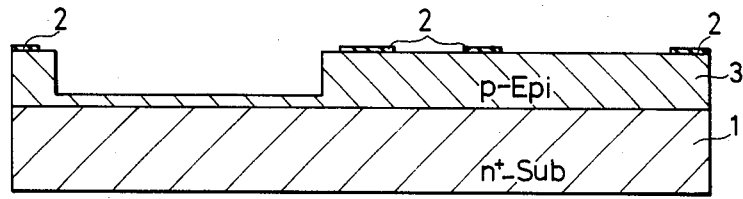
Figure 9C:
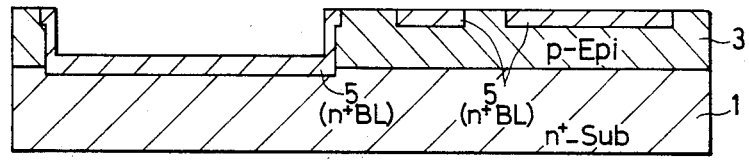
Figure 9D:
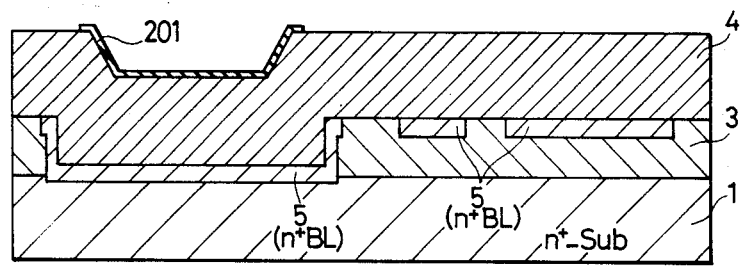
Figure 9E:
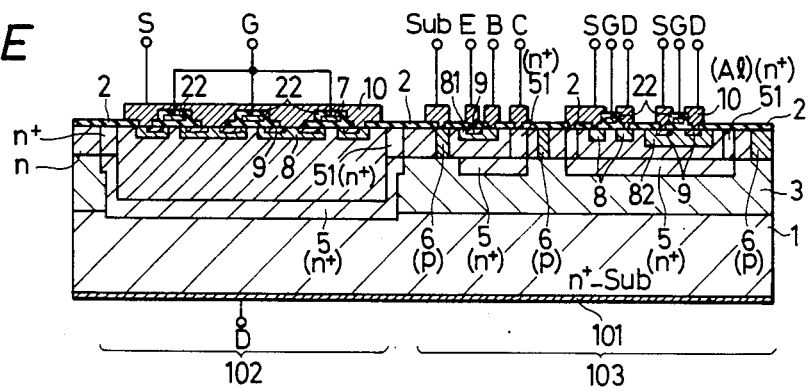

According to this embodiment as shown in FIG. 9A, even when the p-type epitaxial layer 3, that is removed by etching, is left maintaining a reduced thickness on the high-voltage portion as shown in FIG. 9A, the high-voltage portion is connected to the n+-type substrate 1 through the n+-type buried layer 5 that is formed as shown in FIG. 9C, obviating the need of forming a deep n+-type penetration layer required in the conventional technology. Therefore, the p-type epitaxial layer 3 can be easily formed having a thickness greater than that of the embodiment of FIG. 7. FIG. 9B illustrates a section view showing the oxide film 2 selectively removed to make windows through which the N+-type buried layer 5 is formed. FIG. 9D illustrates a section view showing the oxide film 201 used in flattening the exposed surface of n-type expitaxial layer 4. In this embodiment, furthermore, an n+-type diffusion layer 51 is formed in the n-type epitaxial layer 4 between the portion of power MOSFET and the p-type diffusion layer 6 for isolation. Therefore, the parasitic channel is prevented from developing between the portion of power MOSFET and the low-voltage portion even when a p-type inverted layer is formed by the floating charge. In particular, in the case of the high-side switch in which a potential higher than the potential (most negative voltage) of the diffusion layer 6 for isolation is applied to the source of the power MOSFET, a parasitic MOS transistor easily develops. Therefore, provision of the n+-type diffusion layer 51 is very effective to prevent the parasitic channel from developing. The n+-type diffusion layer 51 is also effective for preventing the depletion layer, that extends from the diffusion layer 6 for isolation, from punching through to the source of the power MOSFET. As shown in FIG. 9E, furthermore, provision of the n+-type diffusion layer 51 in the collector portion of the small-signal npn bipolar transistor helps decrease the collector series resistance despite the formation of the epitaxial layer 4 of a high resistivity to increase the breakdown voltage of the portion of power MOSFET, and characteristics of the small-signal portion are not deteriorated. Furthermore, the CMOS logic portion is formed in the thin epitaxial layer 4 and is surrounded by the n+-type buried layer 5 and the n+-type diffusion layer 51 to decrease the series resistance. This helps solve the problem in that latch-up easily takes place due to increased resistivity of the n-type epitaxial layer 4 since there also exists the high-voltage power MOSFET.

The low-voltage control portion mentioned in the above embodiments need not necessarily be constituted by the low-voltage elements only. For instance, the invention does not exclude a high-voltage element which consists of a lateral MOSFET. Such an element is provided when a high gate voltage is needed for the vertical power MOSFET.

According to the present invention in which the epitaxial layer of the second conductivity type is buried in the semiconductor substrate of the first conductivity type as described above, there is no need of forming the penetration layer of the first conductivity type that is required in the conventional technology. Therefore, there is no need of effecting the diffusion step at a high temperature for an extended period of time, making it possible to eliminate such problems as the increase of the area due to the expansion of the penetration layer of the first conductivity type in the lateral direction, generation of noise in the transistor due to disturbance in the crystallinity of the semiconductor caused by the heat-treatment effected for an extended period of time, and decrease of yield. Furthermore, the portion of a vertical high-current transistor can be realized in the lightly doped first conductivity type layer/heavily doped first conductivity type layer substrate structure like that of a discrete device. Moreover, the heavily doped buried layer of the first conductivity can be easily formed in a portion of the control circuit, making it possible to form a portion of high-current vertical power transistor and a portion of control circuit in the same chip under optimal conditions for each of the structures. When it is desired to further increase the breakdown voltage of the portion of high-current vertical power transistor, the heavily doped buried layer should be formed in the control device portion to improve the performance.

It is to be further understood by those skilled in the art that the foregoing description has dealt with preferred embodiments of the disclosed device and that various changes and modifications may be made in the invention without departing from the spirit and scope thereof.

What is claimed is:

1. A method of fabricating semiconductor devices comprising:
   a step for forming a well by selectively etching a semiconductor substrate of a first conductivity type
   a step for epitaxially growing a first epitaxial layer having a second conductivity type opposite to said first conductivity type so as to fill said well;
   a step for epitaxially growing a second epitaxial layer of the first conductivity type on said substrate and on said first epitaxial layer;
   a step for forming an impurity-doped layer of the second conductivity type for isolation in said second epitaxial layer ro penetrate through said second epitaxial layer to said first epitaxial layer;
   a step for forming a first transistor in a portion of said second epitaxial layer corresponding to said well; and
   a step for forming a second transistor having a vertical structure, and a current capability higher than that of said first transistor in a portion of said second eptitaxial layer other than the portion of the second epitaxial layer corresponding to said well.

2. A method of fabricating semiconductor devices according to claim 1, wherein after said epitaxial layer is formed, a heavily doped buried layer of the first conductivity type is formed in said first epitaxial layer, and then said second epitaxial layer is formed.

3. A method of fabricating semiconductor devices according to claim 1, wherein said first transistor consists of a bipolar transistor and said second transistor consists of a MOS transistor.

4. A method of fabricating semiconductor devices according to claim 1, wherein said first transistor consists of a bipolar transistor and a MOS transistor, and said second transistor consists of a MOS transistor.

5. A method of fabricating semiconductor devices according to claim 1, wherein said first transistor consists of a bipolar transistor and a MOS transistor, and said second transistor consists a bipolar transistor.

6. A method of fabricating semiconductor devices according to claim 1, including the further step of forming a diffusion layer of the first conductivity type, extending through the second epitaxial layer, said diffusion layer being positioned between the second transistor and the impurity-doped layer for isolation.

7. A method of fabricating semiconductor devices according to claim 1, wherein said first transistor includes an n-channel MOSFET and a p-channel forming a CMOS structure.

8. A method of fabricating semiconductor devices according to claim 1, wherein said second transistor is a power npn transistor.

9. A method of fabricating semiconductor devices according to claim 1, wherein said step for epitaxially growing the first epitaxial layer having the second conductivity type opposite to the first conductivity type further comprises:
  a step for forming a first insulating film on said substrate;
  a step for patterning said first insulating film by photoetching into a desired shape;
  a step for forming a well in said semiconductor substrate by etching with said first insulating film as a mask;
  a step for removing said first insulating film;
  a step for epitaxialky growing said first epitaxial layer on said semiconductor substrate;
  a step for forming an etching-resistant film in a portion of said first epitaxial layer that corresponds to said well; and
  a step for removing a portion of said first epitaxial layer so as to provide a filled well.

10. A method of fabricating semiconductor devices according to claim 9, wherein the step fro removing a portion of the first epitaxial layer includes etching the first epitaxial layer.

11. A method of fabricating semiconductor devices according to claim 9, wherein the step for removing a portion of the first epitaxial layer includes grinding and polishing the first epitaxial layer.

12. A method of fabricating semiconductor devices according to claim 9, wherein the step for removing a portion of the first epitaxial layer includes etching and polishing the first epitaxial layer.

13. A method of fabricating semiconducttor devices according to claim 9, wherein after said first epitaxial layer is formed, a heavily doped buried layer of the first conductivity type is provided in said first epitaxial layer, and then said second epitaxial layer is formed.

14. A method of fabricating semiconductor devices according to claim 13, wherein said first transistor consists of a bipolar transistor and said second element consists of a MOS transistor.

15. A method of fabricating a semiconductor device according to claim 13, wherein said first element consists of a bipolar transistor and a MOS transistor, and said second element consists of a MOS transistor.

16. A method of fabricating semiconductor devices according to claim 1, wherein said step for epitaxially growing a first epitaxial layer includes sub-steps of forming the first epitaxial layer to fill the well and to extend on the substrate, and of removing a portion of the formed first epitaxial layer so as to leave the well filled with a remaining portion of the first epitaxial layer.

17. A method of fabricating semiconductor devices according to claim 16, wherein the sub-step of removing a portion of the first epitaxial layer provides a planor surface of the filled well and substrate surface.

18. A method of fabricating semiconductor devices according to claim 16, wherein the sub-step of removing exposes the substrate surface.

19. A method of fabricating semiconductor devices according to claim 11, wherein the sub-step of removing includes etching the first epitaxial layer.

20. A method of fabricaring semiconductor devices according to claim 16, wherein the sub-step of removing includes grinding and polishing the first epitaxial layer.

21. A method of fabricating semiconductor devices according to claim 16, wherein the sub-step of removing includes etching and polishing the first epitaxial layer.

22. A method of fabricating semiconductor devices comprising:
  a step for epitaxially growing a first epitaxial layer having a second conductivity type opposite to a first conductivity type on a semiconductor substrate of said first conductivity type;
  a step for forming a first insulating film on said first epitaxial layer;
  a step for patterning said first insulating film by photoetching into a desired shape;
  a step for forming a well in said first epitaxial layer by etching with said first insulating film as a mask;
  a step for removing said first insulating film;
  a step for epitaxially growing a second epitaxial layer of the first conductivity type on said first epitaxial layer and in said well;
  a step for removing a portion of said second epitaxial layer so as to provide a filled well;
  a step for forming an impurity-doped layer of the second conductivity type for isolation in said second epitaxial layer so as to penetrate through the second epitaxial layer to the first epitaxial layer;
  a step for forming at least one first transistor having a vertical structure in a portion of said second epitaxial layer that corresponds to said well; and
  a step for forming at least one second transistor in said second epitaxial layer in a portion other than the portion that corresponds to said well, a first transistor having a current capability higher than that of the at least one second transistor.

23. A method of fabricating semiconductor devices according to claim 22, wherein the step of removing a portion of the second epitaxial layer leaves a remaining portion on the substrate and in the well.

24. A method of fabricating semiconductor devices according to claim 22, wherein the step for removing is performed by etching, and the method includes the further steps of forming an etching-resistant film on a portion of the second epitaxial layer that corresponds to said well prior to the etching, and removing the etching-resistant film after the etching, the etching being performed using the etching-resistant film as a mask.

25. A method of fabricating semiconductor devices according to claim 22, wherein the step for removing is performed by grinding and polishing.

26. A method of fabricating semiconductor devices according to claim 22, wherein the step for removing is performed by grinding and polishing.

* * * * *